United States Patent [19]

Martin

[11] Patent Number: 4,988,415

[45] Date of Patent: Jan. 29, 1991

[54] METHOD OF PRODUCING AN ANTI-WEAR COATING INCLUDING A CHROMIUM LAYER ON A SURFACE OF A STRUCTURAL PART OF TITANIUM OR TITANIUM-BASED ALLOY

[75] Inventor: Thoma Martin, Munich, Fed. Rep. of Germany

[73] Assignee: MTU Motoren-und Turbinen-Union Munchen GmbH, Postfach, Fed. Rep. of Germany

[21] Appl. No.: 462,306

[22] Filed: Dec. 24, 1989

Related U.S. Application Data

[63] Continuation of Ser. No. 195,494, May 18, 1988, abandoned.

[30] Foreign Application Priority Data

May 20, 1987 [DE] Fed. Rep. of Germany ....... 3716937

[51] Int. Cl.$^5$ .............................................. C23C 28/02
[52] U.S. Cl. .................................. 204/37.1; 204/35.1; 204/38.4
[58] Field of Search .................... 204/32.1, 35.1, 37.1, 204/38.4

[56] References Cited

U.S. PATENT DOCUMENTS

| | | | |
|---|---|---|---|
| 2,825,682 | 3/1958 | Missel et al. | 204/38 |
| 3,065,154 | 11/1962 | Wiesner | 204/32 |
| 3,691,029 | 9/1972 | Raymond et al. | 204/37.1 |
| 4,588,480 | 5/1986 | Thoma | 204/37.1 |

FOREIGN PATENT DOCUMENTS

| | | |
|---|---|---|
| 3443329 | 12/1983 | Fed. Rep. of Germany . |
| 244574 | 4/1987 | Fed. Rep. of Germany . |
| 2188942 | 10/1987 | United Kingdom . |

OTHER PUBLICATIONS

F. A. Lowenheim, Electroplating, McGraw-Hill Book Co., New York, 1978, pp. 230–247.

*Primary Examiner*—John F. Niebling
*Assistant Examiner*—William T. Leader
*Attorney, Agent, or Firm*—Ladas & Parry

[57] ABSTRACT

An anti-wear coating is produced on the surface of a structural part of titanium or titanium alloy by forming a chromium layer on a nickel-titanium diffusion layer on the surface of the part.

7 Claims, No Drawings

METHOD OF PRODUCING AN ANTI-WEAR COATING INCLUDING A CHROMIUM LAYER ON A SURFACE OF A STRUCTURAL PART OF TITANIUM OR TITANIUM-BASED ALLOY

This is a continuation of copending application Ser. No. 07/195,494 filed on May 18, 1988, now abandoned.

FIELD OF THE INVENTION

The present invention relates to a method of producing anti-wear layers on the surfaces of structural parts consisting of titanium and titanium-base alloys. Titanium alloys are used in gas-turbine propulsion plants and for structural parts for aeronautical and space travel, such as landing flap guides, valve housings, compass housings, pump rotors and the like.

PRIOR ART

Since titanium alloys are very sensitive to wear, an anti-wear coating is necessary in many cases. A known method of producing anti-wear layers of the present type is described in Applicant's prior Pat. No. 4,588,480.

SUMMARY OF THE INVENTION

An object of the present invention is to provide improvements in the known method for the production of anti-wear layers thereby assuring it an even broader range of use in connection with the coating of structural parts of titanium or titanium alloys.

This object is achieved by providing a chromium layer on the conventional anti-wear layer. Composite materials with titanium can also be coated in this way.

In accordance with the invention, a layer of chromium is galvanically deposited from a galvanic bath containing $CrO_3$ onto an anti-wear layer of titanium-nickel which is formed as a diffusion layer on the surface of the structural part.

A main advantage of the method of the invention is that by forming a firmly adherent chrome layer on titanium or titanium-alloy structural parts, which was not to be expected in accordance with the prior state of the art, the possibilities of use of the titanium or titanium-alloy parts are expanded, inter alia, as structural parts, housing parts, cowlings, radomes, compressor blades (rotor and stator), fan blades, and propfans.

DETAILED DESCRIPTION OF A PREFERRED EMBODIMENT

The invention will be described hereafter in relation to a specific embodiment thereof with reference to the following example.

EXAMPLE

A strongly adherent chrome plating is formed on a surface of a structural part of titanium or titanium-based alloys according to the following steps.

A structural part of titanium or a titanium-base alloy was coated with a layer of nickel by a chemical deposition in accordance with the procedure set forth in my earlier Pat. No. 4,588,480.

The thus coated part was subjected to a heat treatment at a temperature of at least 450° C. to produce diffusion layers of $TiNi_3$ and $Ti_2Ni$ after about 16 hours in air.

Excess nickel is removed chemically by a nitroaromatic cyanide solution or $HNO_3$.

Up to this point, the procedure is that which is disclosed in my prior Pat. No. 4,588,480.

The $TiNi_3$ can optionally be removed, but the treatment according to the present invention can be carried out with or without the diffusion layer on the structural part.

The structural part with both diffusion layers or with one diffusion layer is submerged in a galvanic bath containing $CrO_3$ so that a layer of chromium is formed on the diffusion layer on the titanium part.

In particular the galvanic bath is composed as follows:

$CrO_3$, 250 g/l.
$H_2SO_4$, 1.6 g/l.
$H_2SiF_6$, 4 g/l.

The galvanic deposition is carried out at a temperature of 55° C. and a current density of 20–80 A/dm2 for a period of time of 3–12 hours. By controlling the temperature, current density, and time of deposition, the thickness of the chrome layer can be controlled. Following the temperature and time in the above example at the indicated current densitly, a chromium layer of a thickness of 50–100 μm is obtained. It was found that this thickness of chromium layer improved properties of wear resistance on the part with the diffusion layer.

According to a modified galvanic deposition, the galvanic bath is constituted of 265 g/l $CrO_3$ and 1% by weight $H_2SO_4$ referred to $CrO_3$ and deposition was carried out at a temperature of 50° C. and a current density of 20–80 A/dm$^2$ for a period of time of 3–12 hours. A chrome layer of a thickness of 50–100 μm was formed on the titanium-nickel diffusion layer on the structural part.

It was found that modification of the amounts of the contents of the galvanic baths could be varied by ±10 % without any substantial effect on the chrome layer which was formed. It was also found that the temperature at which galvanic deposition was carried out can vary between room temperature and 80° C. without any substantial change in the formation of the anti-wear chrome layer.

Although the invention has been described in connection with specific embodiments thereof, it will become apparent to those skilled in the art that numerous modifications and variations can be made within the scope and spirit of the invention as defined in the attached claims.

What is claimed is :

1. In a method of producing an anti-wear layer on a surface of a structural part of titanium or a titanium alloy including the steps of chemically depositing an adherent layer of nickel on a surface of a structural part of titanium or a titanium alloy, heat treating at a temperature of at least 450° C. the thus coated part to produce diffusion layers of $TiNi_3$ and $Ti_2Ni$ between the nickel layer and the titanium part and removing any nickel still present, the improvement comprising galvanically depositing a layer of chromium from a galvanic bath containing $CrO_3$ onto one of said diffusion layers.

2. The improvement as claimed in claim 1, wherein said heat treating is carried out for a period of time of about 16 hours in an oxygen-containing atmosphere.

3. The improvement as claimed in claim 1 wherein said galvanic bath comprises, in addition to $CrO_3$, $H_2SiF_6$ and $H_2SO_4$.

4. The improvement as claimed in claim 1 wherein the galvanic deposition is carried out in the galvanic bath with a current density of 20 to 80 A/dm$^2$.

5. The improvement as claimed in claim 1 wherein said galvanic bath comprises
   250 grams per liter of said $CrO_3$,
   1.6 grams per liter $H_2SO_4$,
   4 grams per liter $H_2SiF_6$,
   said galvanic deposition being carried out at a temperature of 55° C. and a current of 20 to 80 A/dm².

6. The improvement as claimed in claim 1 wherein the galvanic deposition is effected at a temperature of 50° C. and a current density of 20 to 80 A/dm² in the galvanic bath which comprises 265 g/l of said $CrO_3$ and 1% by weight $H_2SO_4$, referred to $CrO_3$.

7. The improvement as claimed in claimed 1 wherein the temperature, time and current density of the galvanic deposit are controlled such that the chromium layer is deposited on the diffusion layer of titanium nickel with a thickness of 50–100 μm.

* * * * *